United States Patent [19]
Lin

[11] Patent Number: 5,993,566
[45] Date of Patent: Nov. 30, 1999

[54] FABRICATION PROCESS OF NI-MN SPIN VALVE SENSOR

[75] Inventor: Tsann Lin, Saratoga, Calif.

[73] Assignee: International Business Machines Corporation, Armonk, N.Y.

[21] Appl. No.: 08/949,065

[22] Filed: Oct. 10, 1997

Related U.S. Application Data

[63] Continuation-in-part of application No. 08/922,963, Sep. 3, 1997.

[51] Int. Cl.[6] .................................................. C21D 1/04
[52] U.S. Cl. .................... 148/108; 29/603.08; 360/113
[58] Field of Search ............................ 148/108; 360/113; 29/603.08

[56] References Cited

U.S. PATENT DOCUMENTS

| | | | |
|---|---|---|---|
| 5,014,147 | 5/1991 | Parkin et al. | 360/113 |
| 5,206,590 | 4/1993 | Dieny et al. | 324/252 |
| 5,315,468 | 5/1994 | Lin et al. | 360/113 |
| 5,373,238 | 12/1994 | McGuire et al. | 324/252 |
| 5,436,778 | 7/1995 | Lin et al. | 360/113 |
| 5,492,720 | 2/1996 | Gill et al. | 427/131 |
| 5,561,368 | 10/1996 | Dovek et al. | 324/252 |
| 5,772,794 | 6/1998 | Uno et al. | 148/108 |

OTHER PUBLICATIONS

"NiMn–Pinned Spin Valves With High Pinning Field Made by Ion Beam Sputtering", S. Mao et al., Appl.Phys.Lett. 69 (23), Dec. 2, 1996, pp. 3593–3595.

"Exchange–Coupled Ni–Fe/Fe–Mn, Ni–Mn and NiO/Ni–Fe Films for Stabilization of Magnetoresistive Sensors", T. Lin, et al., IEEE Trans. on Mags., vol. 31, No. 6, Nov. 1995, pp. 2585–2590.

"Improved Exchange Coupling Between Ferromagnetic Ni–Fe and Antiferrogmanetic Ni–Mn–Based Films", T. Lin et al., App.Phys.Lett 65 (9), Aug. 29, 1994, pp. 1183–1185.

*Primary Examiner*—Scott Kastler
*Attorney, Agent, or Firm*—Paik Saber

[57] ABSTRACT

A spin valve (SV) sensor having a Ni—Mn antiferromagnetic (AFM) layer, a pinned layer, a free layer and a spacer layer disposed between said free and pinned layers. The pinned layer is formed over and in contact with the antiferromagnetic (AFM) Ni—Mn layer where the combination of the AFM and pinned layers is first annealed before depositing the rest of the SV layers. Carrying out the annealing process of the combination of the AFM and pinned layers prior to deposition of the rest of the SV layers provides the exchange coupling field necessary to pin the pinned layer while avoiding thermal degradation of the SV sensor giant magnetoresistive effect.

16 Claims, 7 Drawing Sheets

FABRICATION PROCESS OF NI-MN SPIN VALVE SENSOR

This application is a continuation-in-part of application Ser. No. 08/922,963, filed on Sep. 3, 1997, entitled "Novel Fabrication Process of Ni—Mn Spin Valve Sensor", in the name of Tsann Lin.

BACKGROUND OF THE INVENTION

1. Field of the Invention

This invention relates generally to magnetic transducers for reading information signals from a magnetic medium and, in particular, to an improved process for fabrication of a spin valve magnetoresistive read sensor.

2. Description of Related Art

Computers often include auxiliary memory storage devices having media on which data can be written and from which data can be read for later use. A direct access storage device (disk drive) incorporating rotating magnetic disks are commonly used for storing data in magnetic form on the disk surfaces. Data is recorded on concentric, radially spaced tracks on the disk surfaces. Magnetic heads including read sensors are then used to read data from the tracks on the disk surfaces.

In high capacity disk drives, magnetoresistive read sensors, commonly referred to as MR heads, are the prevailing read sensors because of their capability to read data from a surface of a disk at greater linear densities than thin film inductive heads. An MR sensor detects a magnetic field through the change in the resistance of its MR sensing layer (also referred to as an "MR element") as a function of the strength and direction of the magnetic flux being sensed by the MR layer.

One type of MR sensor currently under development is giant magnetoresistive (GMR) sensors manifesting the GMR effect. In the GMR sensors, the resistance of the MR sensing layer varies as a function of the spin-dependent transmission of the conduction electrons between the magnetic layers separated by a non-magnetic layer (spacer) and the accompanying spin-dependent scattering which takes place at the interface of the magnetic and non-magnetic layers and within the magnetic layers.

GMR sensors using only two layers of ferromagnetic material (e.g., Ni—Fe or Co or Ni—Fe/Co) separated by a layer of non-magnetic metallic material (e.g., copper) are generally referred to as spin valve (SV) sensors manifesting the SV effect. In an SV sensor, one of the ferromagnetic layers, referred to as the pinned layer, has its magnetization typically pinned by exchange coupling with an antiferromagnetic (e.g., Fe—Mn or NiO) layer. The pinning field generated by the antiferromagnetic layer should be greater than demagnetizing fields (about 200 Oe) at the operating temperature of the SV sensor (about 120 C.) to ensure that the magnetization direction of the pinned layer remains fixed during the application of external fields (e.g., fields from bits recorded on the disk). The magnetization of the other ferromagnetic layer, referred to as the free layer, however, is not fixed and is free to rotate in response to the field from the disk.

The SV effect, i.e., the net change in resistance, exhibited by a typical prior art SV sensor with Ni—Fe free and pinned layers is about 3% to 4%. U.S. Pat. No. 5,206,590 entitled "Magnetoresistive Sensor Based On The Spin Valve Effect", granted to Dieny et al. on Apr. 27, 1993 and incorporated herein by reference, discloses a GMR sensor operating on the basis of the spin valve effect.

FIG. 1 shows a prior art SV sensor 100 comprising end regions 104 and 106 separated by a central region 102. A free layer 110 is separated from a pinned layer 120 by a non-magnetic, electrically-conducting spacer layer 115. The magnetization of the pinned layer 120 is fixed by an anti-ferromagnetic (AFM) layer 125 in a transverse direction (perpendicular to an air bearing surface). Free layer 110, spacer layer 115, pinned layer 120 and the AFM layer 125 are all formed in the central region 102. Hard bias layers 130 and 135 formed in the end regions 104 and 106, respectively, provide longitudinal bias for the free layer 110. Leads 140 and 145 formed over hard bias layers 130 and 135, respectively, provide electrical connections for the flow of the sensing current $I_s$ from a current source 160 to the SV sensor 100. Sensing means 170 connected to leads 140 and 145 sense the change in the resistance due to changes induced in the free layer 110 by the external magnetic field (e.g., field generated by a data bit stored on a disk).

As mentioned above, the magnetization of the pinned layer 120 in the prior art SV sensor 100 is generally fixed through exchange coupling with AFM layer 125 of antiferromagnetic material such as Fe—Mn or NiO. However, both Fe—Mn and NiO have rather low blocking temperatures (blocking temperature is the temperature at which the pinning field for a given material reaches zero Oe) which make their use as an AFM layer in an SV sensor difficult and undesirable.

Referring to FIG. 2, there is shown the change in the unidirectional anisotropy field ($H_{UA}$) or pinning field versus temperature for 5 nm thick Ni—Fe pinned layers using Fe—Mn, NiO and Ni—Mn as the pinning layers. Fe—Mn has a blocking temperature of about 180 C. (curve 210) and NiO has a blocking temperature of about 220 C. (curve 220). Considering that a typical SV sensor used in a magnetic recording disk drive should be able to operate reliably at a constant temperature of about 120 C. with a pinning field of at least 200 Oe, it can readily be seen that Fe—Mn substantially loses it ability to pin the pinned layer at about 120 C. (pinning field dropping to about 150 Oe) and NiO can only marginally provide adequate pinning at about 120 C. (pinning field dropping to about 170 Oe). It should be noted that once the pinning effect is lost, the SV sensor loses its SV effect either totally or partially, rendering the SV sensor useless. In contrast, it can be seen in FIG. 2 that Ni—Mn with a blocking temperature of beyond 450 C. (curve 230) easily meets the pinning field requirements at the 120 C. operating temperature of typical SV sensors.

However the problem with using Ni—Mn AFM pinning layer is the requirement for high temperature (equal or greater than 240 C.) annealing step after the deposition of the SV sensor layers (post-annealing) to achieve the desired exchange coupling between the Ni—Mn pinning layer and the Ni—Fe pinned layer in order to achieve proper SV sensor operation. Unfortunately, annealing at such high temperature (equal or greater than 240 C.) substantially degrades the GMR coefficient of the SV sensor.

Therefore, there is a need for a process to fabricate SV magnetoresistive sensors using an Ni—Mn AFM pinning layer with Ni—Fe pinned layer that eliminates the undesirable degradation of the SV effect due to the annealing step required to achieve the desired exchange coupling.

SUMMARY OF THE INVENTION

It is an object of the present invention to disclose an improved SV sensor having a Ni—Mn AFM layer.

It is another object of the present invention to disclose a method for fabricating improved GMR or magnetoresistive SV sensors having a Ni—Mn AFM pinning layer.

It is a further object of the present invention to disclose a method for fabricating magnetoresistive SV sensors with a film structure of Ta/Ni—Mn/Ni—Fe/Co/Cu/Co/Ni—Fe/Ta whereby the annealing step to develop exchange coupling is carried out without degradation of the SV effect.

It is yet another object of the present invention to disclose a method for fabricating magnetoresistive SV sensors with a film structure of Ta/Ni—Mn/Ni—Fe/Co/Cu/Ni—Fe/Ta whereby the annealing step to develop exchange coupling is carried out without degradation of the SV effect.

It is still another object of the present invention to disclose a method for fabricating magnetoresistive SV sensors with a film structure of Ta/Ni—Mn/Ni—Fe/Cu/Ni—Fe/Ta whereby the annealing step to develop exchange coupling is carried out without degradation of the SV effect.

It is a still further object of the present invention to disclose an alternative method for fabricating the Ni—Mn/Ni—Fe film structure whereby the annealing process to develop exchange coupling is carried out without degradation of the SV effect.

In accordance with the principles of the present invention, there is disclosed an SV sensor with the preferred structure of Ta/Ni—Mn/Ni—Fe/Co/Cu/Co/Ni—Fe/Ta where the Ni—Fe pinned layer is formed over the Ni—Mn antiferromagnetic layer and the combination of Ni—Mn and Ni—Fe layers is first annealed before depositing the rest of the SV layers. Carrying out the high temperature annealing process of the combination of Ni—Mn and Ni—Fe layers prior to deposition of the rest of the SV layers provides the exchange coupling field necessary to pin the Ni—Fe pinned layer without exposing the rest of the SV layers to the high temperature annealing process thus avoiding lowering the GMR effect.

BRIEF DESCRIPTION OF THE DRAWINGS

For a fuller understanding of the nature and advantages of the present invention, as well as the preferred mode of use, reference should be made to the following detailed description read in conjunction with the accompanying drawings.

DETAILED DESCRIPTION OF THE PREFERRED EMBODIMENT

The following description is the best embodiment presently contemplated for carrying out the present invention. This description is made for the purpose of illustrating the general principles of the present invention and is not meant to limit the inventive concepts claimed herein.

Figure 1:
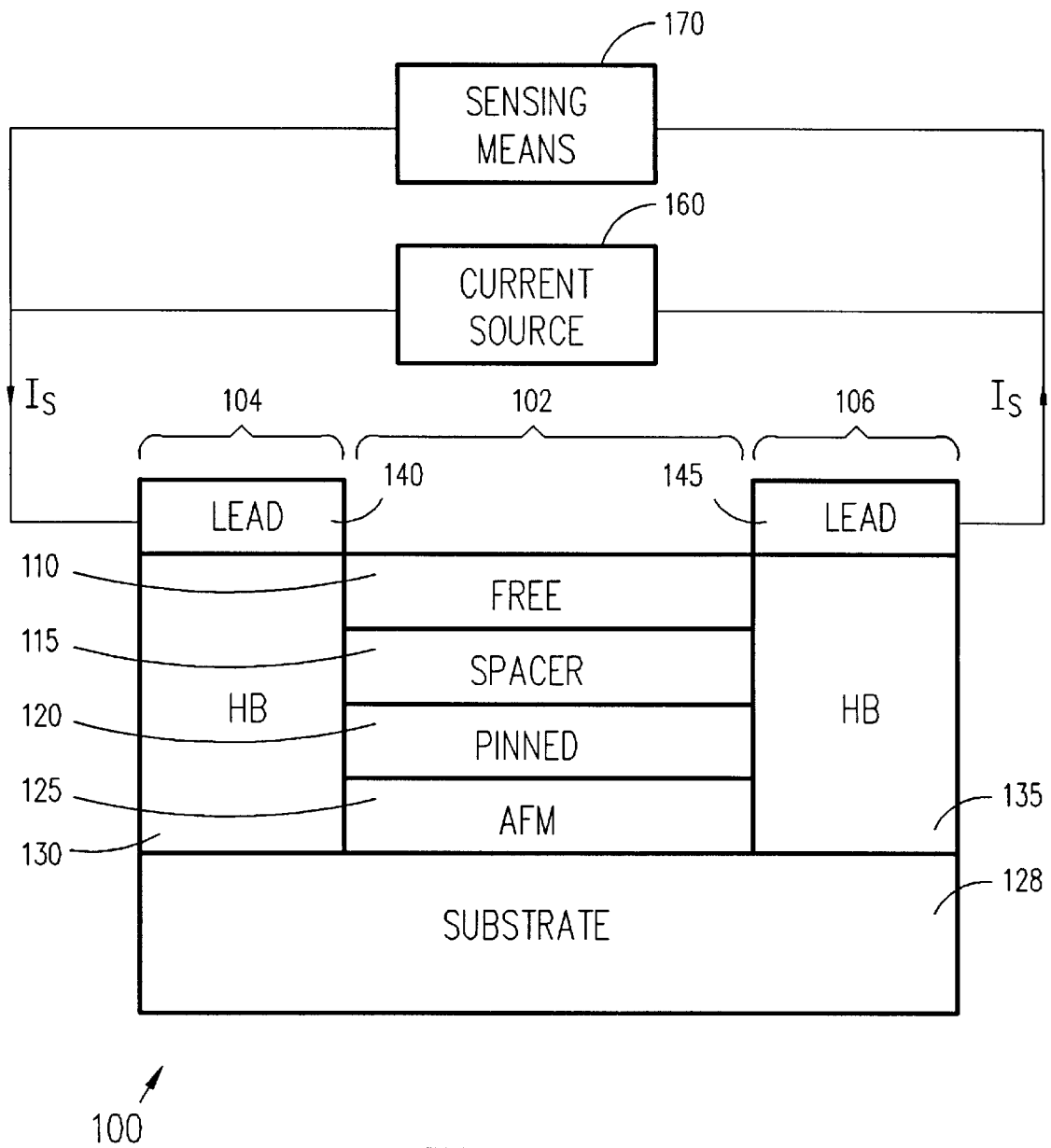
FIG. 1 is a schematic diagram of the cross-section of a prior art SV sensor.
Figure 2:
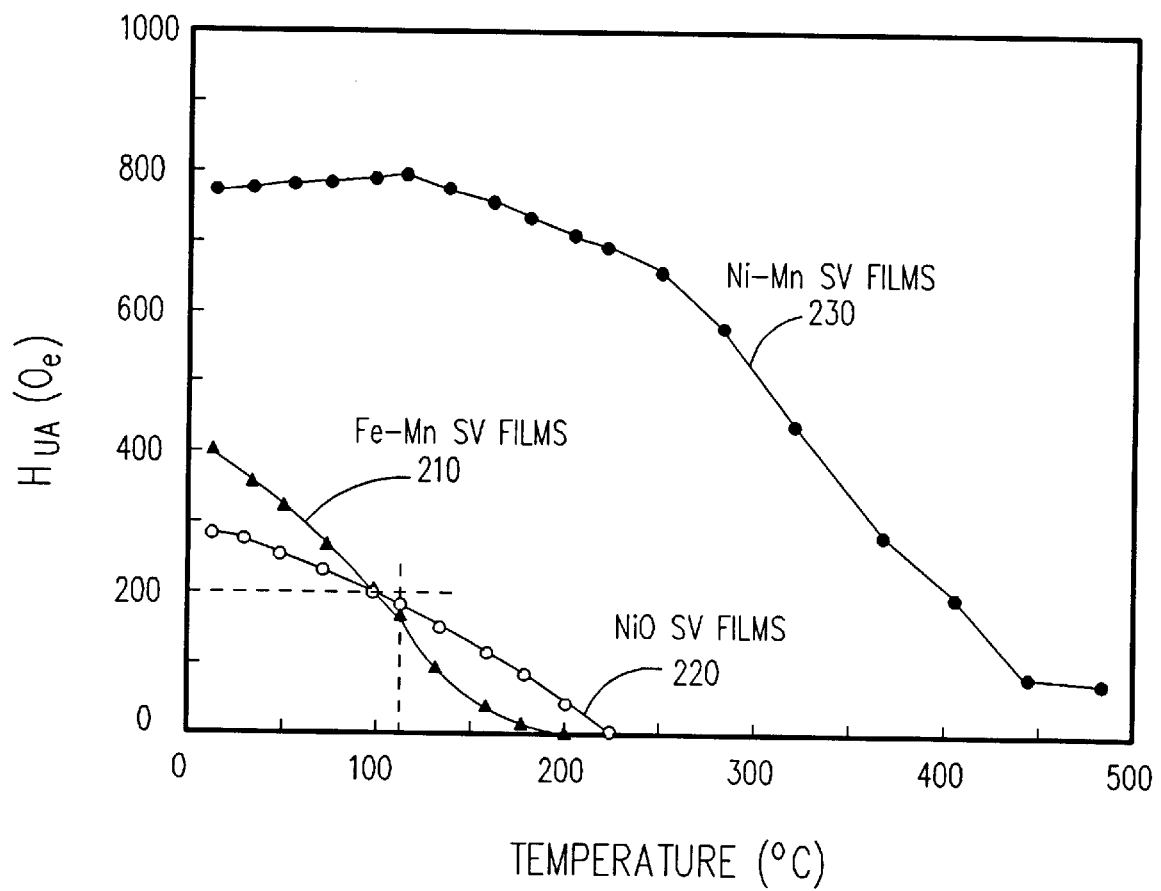
FIG. 2 is a graph showing temperature dependence of the pinning fields for exchange coupling of Fe—Mn, NiO and Ni—Mn antiferromagnetic pinning layers to Ni—Fe ferromagnetic pinned layers.
Figure 3:
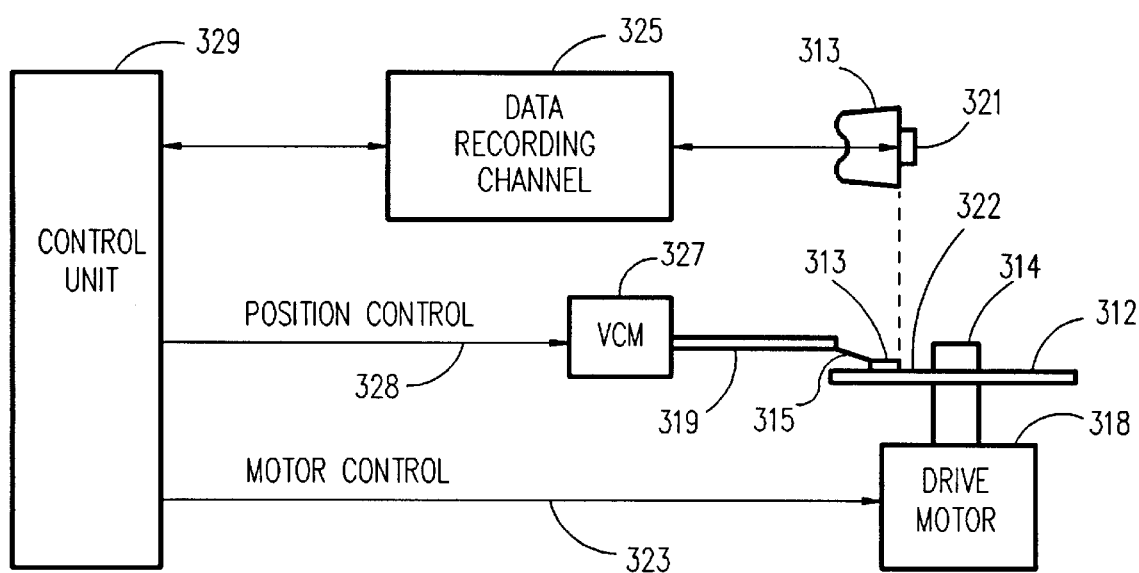
FIG. 3 is a perspective drawing of a magnetic recording disk drive system.

Referring now to FIG. 3, there is shown a disk drive 300 embodying the present invention. As shown in FIG. 3, at least one rotatable magnetic disk 312 is supported on a spindle 314 and rotated by a disk drive motor 318. The magnetic recording media on each disk is in the form of an annular pattern of concentric data tracks (not shown) on disk 312.

At least one slider 313 is positioned on the disk 312, each slider 313 supporting one or more magnetic read/write heads 321 where the head 321 incorporates the MR sensor of the present invention. As the disks rotate, slider 313 is moved radially in and out over disk surface 322 so that heads 321 may access different portions of the disk where desired data are recorded. Each slider 313 is attached to an actuator arm 319 by means of a suspension 315. The suspension 315 provides a slight spring force which biases slider 313 against the disk surface 322. Each actuator arm 319 is attached to an actuator means 327. The actuator means as shown in FIG. 3 may be a voice coil motor (VCM). The VCM comprises a coil movable within a fixed magnetic field, the direction and speed of the coil movements being controlled by the motor current signals supplied by controller 329.

During operation of the disk storage system, the rotation of disk 312 generates an air bearing between slider 313 and disk surface 322 which exerts an upward force or lift on the slider. The air bearing thus counter-balances the slight spring force of suspension 315 and supports slider 313 off and slightly above the disk surface by a small, substantially constant spacing during normal operation.

The various components of the disk storage system are controlled in operation by control signals generated by control unit 329, such as access control signals and internal clock signals. Typically, control unit 329 comprises logic control circuits, storage means and a microprocessor. The control unit 329 generates control signals to control various system operations such as drive motor control signals on line 323 and head position and seek control signals on line 328. The control signals on line 328 provide the desired current profiles to optimally move and position slider 313 to the desired data track on disk 312. Read and write signals are communicated to and from read/write heads 321 by means of recording channel 325.

The above description of a typical magnetic disk storage system, and the accompanying illustration of FIG. 3 are for representation purposes only. It should be apparent that disk storage systems may contain a large number of disks and actuators, and each actuator may support a number of sliders.

Figure 4:
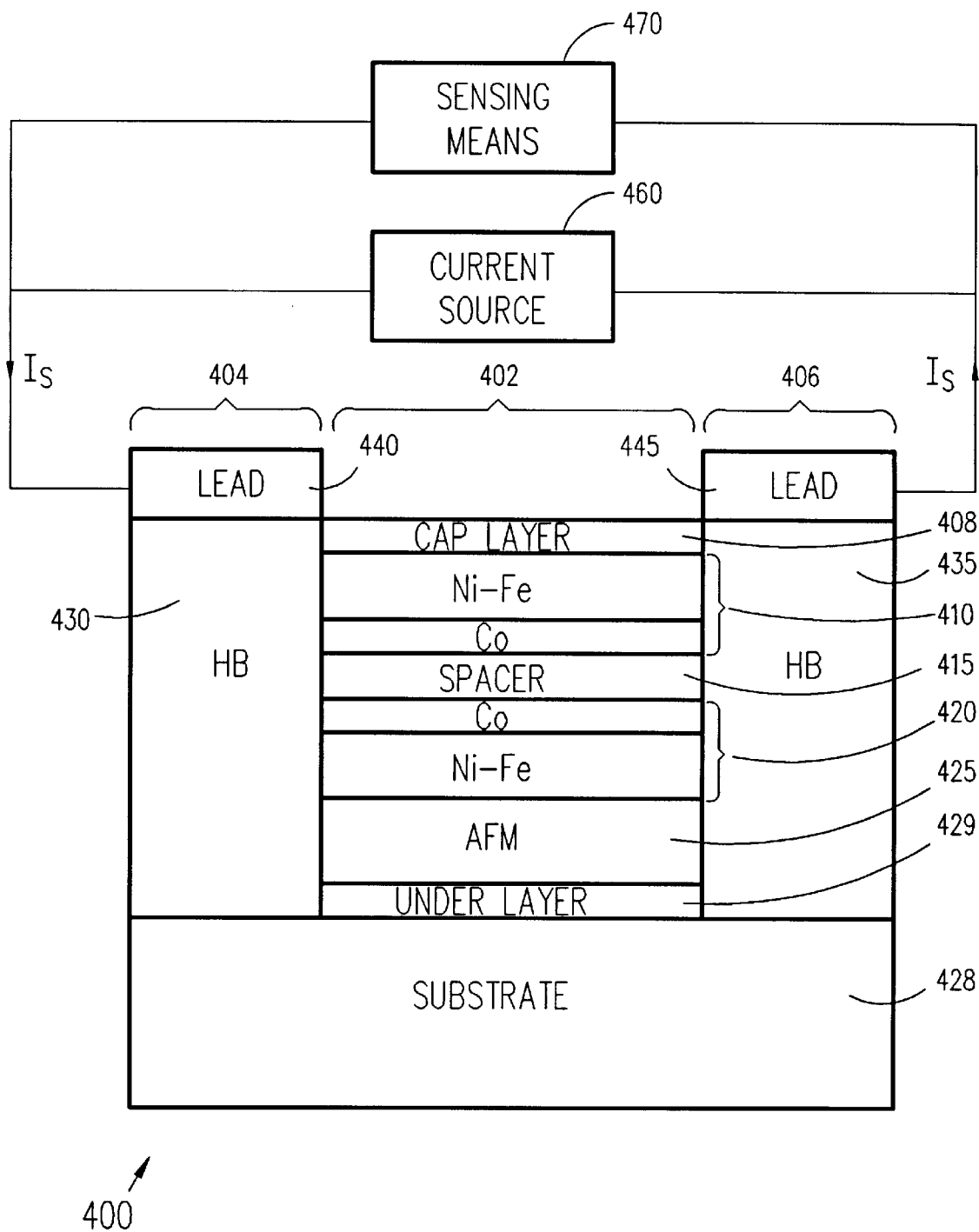
FIG. 4 is a schematic diagram of the cross-section of the preferred SV sensor of the present invention.

Now referring to FIG. 4, there is shown an air bearing surface (ABS) view of the SV sensor 400 having the structure of Ta/Ni—Mn/Ni—Fe/Co/Cu/Co/Ni—Fe/Ta and manufactured, using a sputter deposition process, according to the preferred embodiment of the present invention. SV sensor 400 comprises end regions 404 and 406 separated by a central region 402. A free layer (free ferromagnetic layer) 410, comprising a Ni—Fe layer and a thin Co layer, is separated from a pinned layer (pinned ferromagnetic layer) 420, comprising a Ni—Fe layer and a thin Co layer, by a non-magnetic, electrically-conducting spacer layer 415. The magnetization of the pinned layer 420 is fixed by an antiferromagnetic (AFM) layer 425. An underlayer 429, AFM layer 425, pinned layer 420, spacer layer 415, free layer 410, and a cap layer 408 are all formed in that order in the central region 402. The underlayer 429 or seed layer is any layer deposited to modify the crystallographic texture or grain size of the subsequent layers, and may not be needed depending on the substrate. If used, the underlayer may be formed of tantalum (Ta), zirconium (Zr), hafnium (Hf), or yttrium (Y).

Referring to FIG. 4, the SV sensor 400 further comprises layers 430 and 435 formed in the end regions 404 and 406, respectively, for providing a longitudinal bias field to the free layer 410 to ensure a single magnetic domain state in the free layer. Layers 430 and 435, preferably made of hard magnetic material such as CoPtCr, are deposited and magnetically aligned at room temperature according to the well known methods established in the prior art. Lead layers 440 and 445 are formed over hard bias layers 430 and 435 in the end regions 404 and 406, respectively, by the methods known to the prior art.

Leads 440 and 445 provide electrical connections for the flow of the sensing current $I_s$ from a current source 460 to the SV sensor 400. Sensing means 470 connected to leads 440 and 445 sense the change in the resistance due to changes induced in the free layer 410 by the external magnetic field (e.g., field generated by a data bit stored on a disk).

Figure 5A:
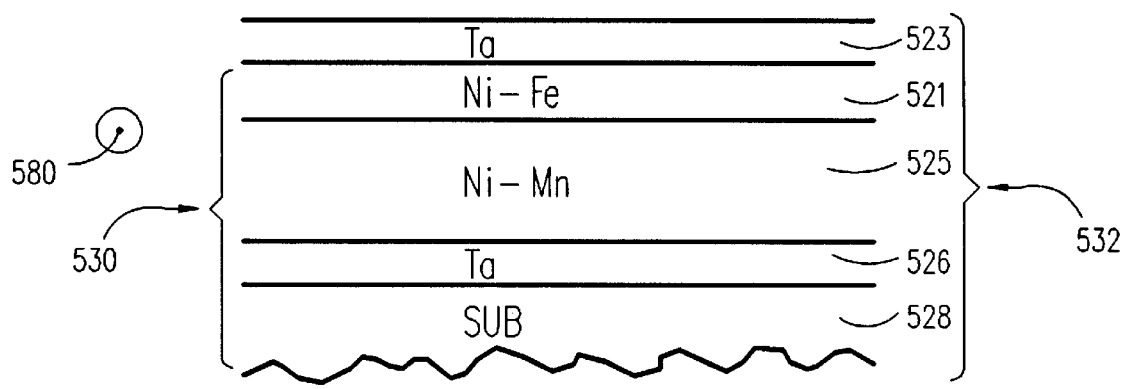
FIGS. 5a and 5b are schematic diagrams of the cross-section of the thin film structure of the present invention at two stages of the deposition process.

Referring now to FIG. 5a, the sputter deposition process for fabrication of the SV sensor 400 is started with deposition on a substrate 528 of a suitable underlayer material such as Ta 526 followed by deposition of a Ni—Mn antiferromagnetic (AFM) pinning layer 525. The preferred composition of the Ni—Mn AFM layer is a Mn composition in the range between 46 and 60 percent. A Ni—Fe pinned layer 521 is subsequently deposited in direct contact and overlaying the Ni—Mn pinning layer 525 followed by a Ta layer 523 to protectively cap the deposited layers. At this stage of the process, annealing of the deposited layers 532 is carried out to increase exchange coupling between the Ni—Mn pinning layer 525 and the Ni—Fe pinned layer 521. As is known in the prior art, the annealing temperature required to increase exchange coupling is equal to or greater than 240 C. With the Ta protective cap layer 523 in place, this anneal step may be carried out ex-situ (that is, outside the sputter deposition system) in an external vacuum oven. Annealing may be carried out at temperatures ranging from 240 C. to 320 C. At the lower annealing temperatures a longer anneal time is required than at higher temperatures to achieve sufficient exchange coupling in the Ni—Mn/Ni—Fe layers. Annealing in a high vacuum oven at 320 C. for a time period in the range from 20 minutes to 100 hours results in sufficient exchange coupling between the AFM and pinned layers. Alternatively, annealing may be carried out at 240 C. for a time period in the range of 2 hours to 100 hours. In the preferred embodiment of the present invention, the annealing step is carried out at 255 C. for 10 hours with the deposited layers 532 in a transverse magnetic field 580 (perpendicular to the air bearing surface). Subsequently, ion milling or reactive ion etching (RIE) is used to remove the Ta cap layer 523 and part of the Ni—Fe pinned layer 521. In the preferred embodiment of the present invention, approximately 10–15 angstroms of the Ni—Fe pinned layer 521 is removed at this step to ensure having a clean Ni—Fe exposed surface. The Ni—Fe pinned layer 521 must not be removed totally to ensure maintenance of exchange coupling between the Ni—Mn and Ni—Fe layers. The film structure 530 is then returned to the sputter deposition system for further processing according to the present invention.

Figure 5B:
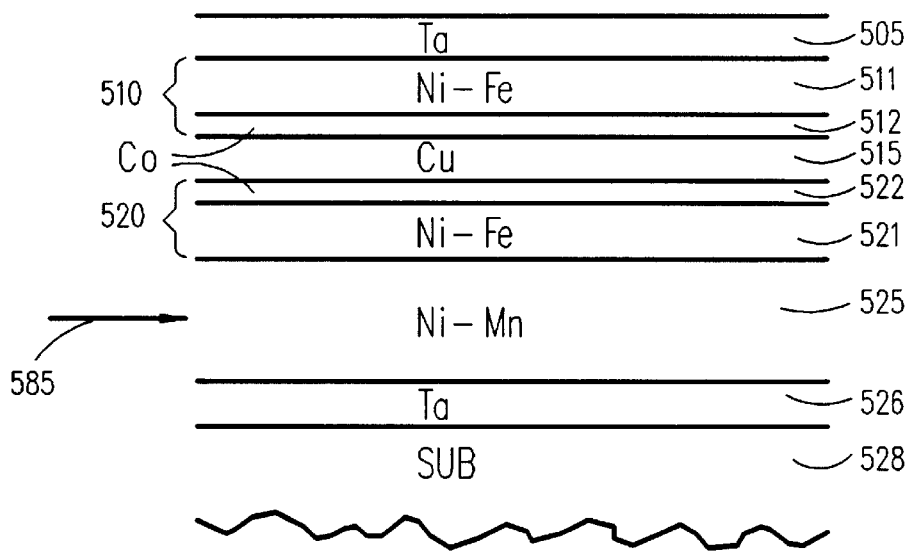

Referring now to FIG. 5b, after the film structure 530 is returned to the sputter deposition system, the remainder of the SV structure is sputter deposited on the exposed Ni—Fe pinned layer 521 in the presence of a longitudinal magnetic field 585 (parallel to the air bearing surface). Thin Co layer 522 is deposited over and in contact with the Ni—Fe pinned layer 521, followed by a thin Cu spacer layer 515, another thin Co layer 512, a Ni—Fe free layer 511 and a Ta cap layer 505. In the preferred embodiment, the pinned layer 520 comprises a Ni—Fe pinned layer 521 and a thin Co layer 522. Similarly, the free layer 510 comprises a thin Co layer 512 and a Ni—Fe free layer 511. This completes processing of the central region of the SV structure of the preferred embodiment of the present invention.

After the formation of the central region of the SV sensor has been completed, end regions are formed which include depositing horizontal bias layers and leads according to the well known methods established in the prior art.

Figure 6A:
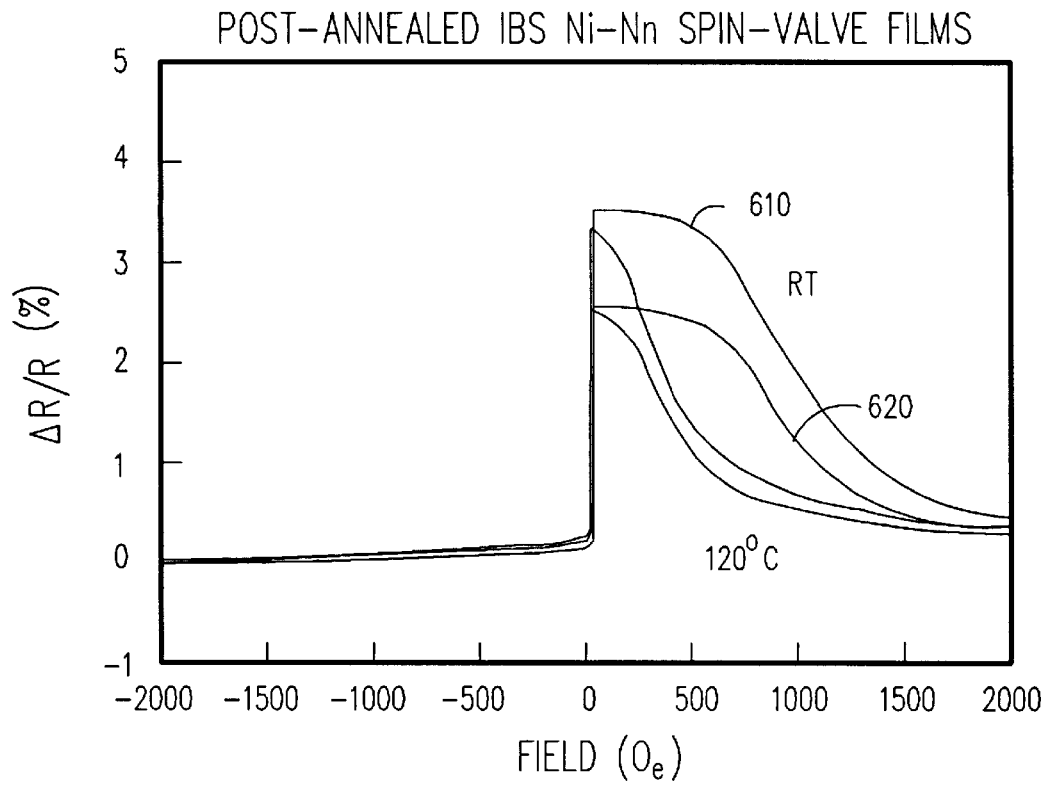
FIGS. 6a and 6b are graphs showing the high field magnetoresistance hysteresis curves of SV sensors fabricated with post-anneal (prior art) and pre-anneal (applicant's invention) processes, respectively, of the Ni—Mn/Ni—Fe layers.
Figure 6B:
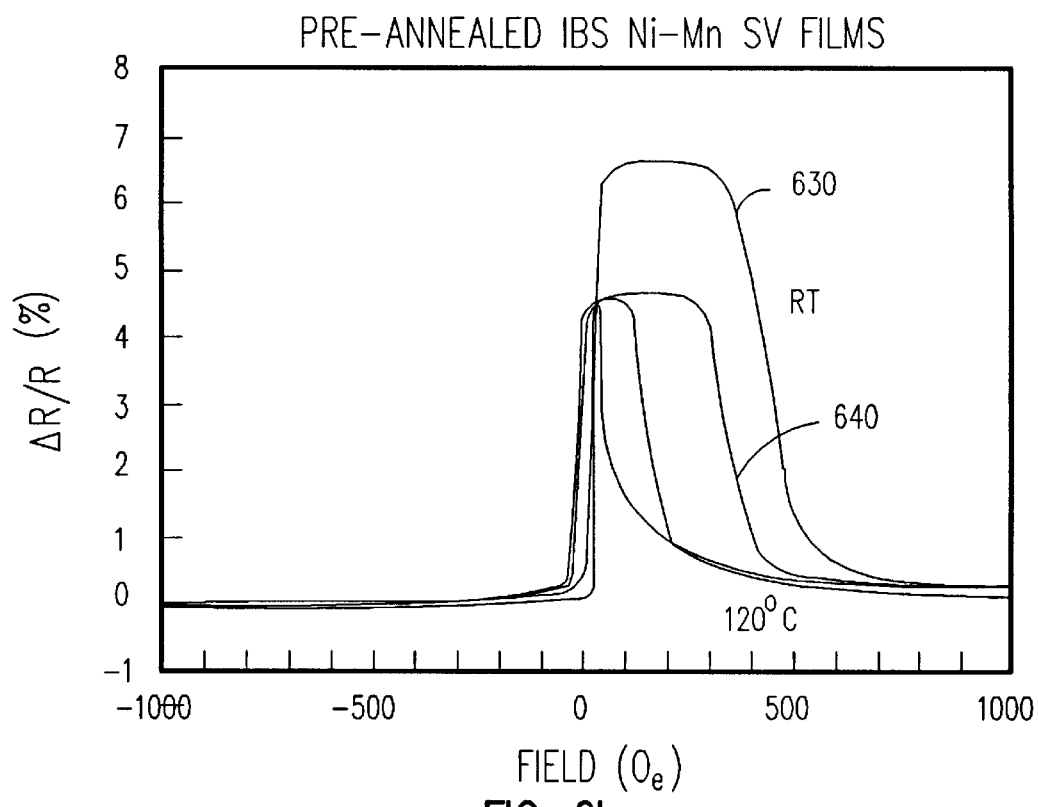

Referring now to FIGS. 6a and 6b, the magnetoresistance of SV sensors fabricated according to the prior art and by the process of this invention, respectively, are shown. FIG. 6a is a graph of the high field magnetoresistance hysteresis curves obtained at room temperature (RT) 610 and at 120 C. 620 for a prior art Ta/Ni—Fe/Co/Cu/Co/Ni—Fe/Ni—Mn/Ta SV sensor annealed after deposition of the entire layer structure (post-annealed). FIG. 6b is a graph of the high field magnetoresistance hysteresis curves obtained at RT 630 and at 120 C. 640 of the present invention Ta/Ni—Mn/Ni—Fe/Co/Cu/Co/Ni—Fe/Ta SV sensor processed according to the present invention by pre-annealing the combination of the Ni—Mn AFM and Ni—Fe pinned layers prior to depositing the remaining SV sensor layers in order to avoid degradation of the SV sensor performance.

TABLE I

|  | GMR Coeff. at RT | GMR Coeff. at 120 C |
|---|---|---|
| Post-annealed Ni—Mn SV sensor (Prior art) | 3.5% | 2.5% |
| Pre-annealed Ni-Mn SV sensor (This invention) | 6.6% | 4.6% |

Table I shows the giant magnetoresistive (GMR) coefficients (deltaR/R) for the prior art and present invention SV devices taken from FIGS. 6a and 6b. The significantly higher GMR coefficients of the present invention SV sensor at both RT and 120 C. demonstrates that the pre-annealing process of the present invention results in improved SV sensor performance.

In an alternative embodiment, a sputter deposition system capable of deposition of the free and pinned ferromagnetic layers in longitudinal and transverse magnetic fields, respectively, and having capability for in-situ (that is, in place in the sputter deposition system) annealing is used.

Figure 7A:
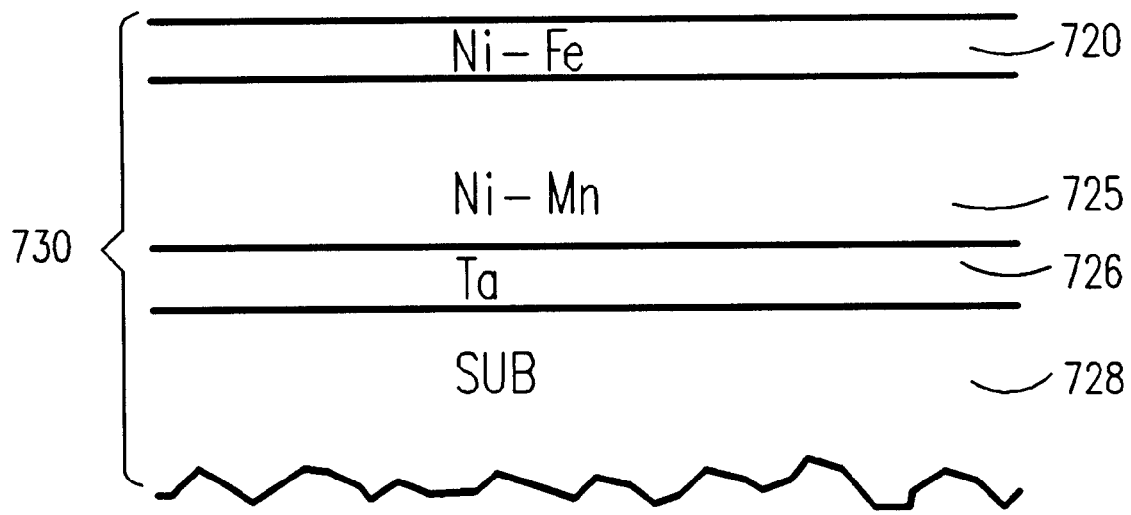
FIGS. 7a and 7b are schematic diagrams of the cross-sections of the thin film structure of an alternate embodiment of the present invention at two stages of the deposition process.
Figure 7B:
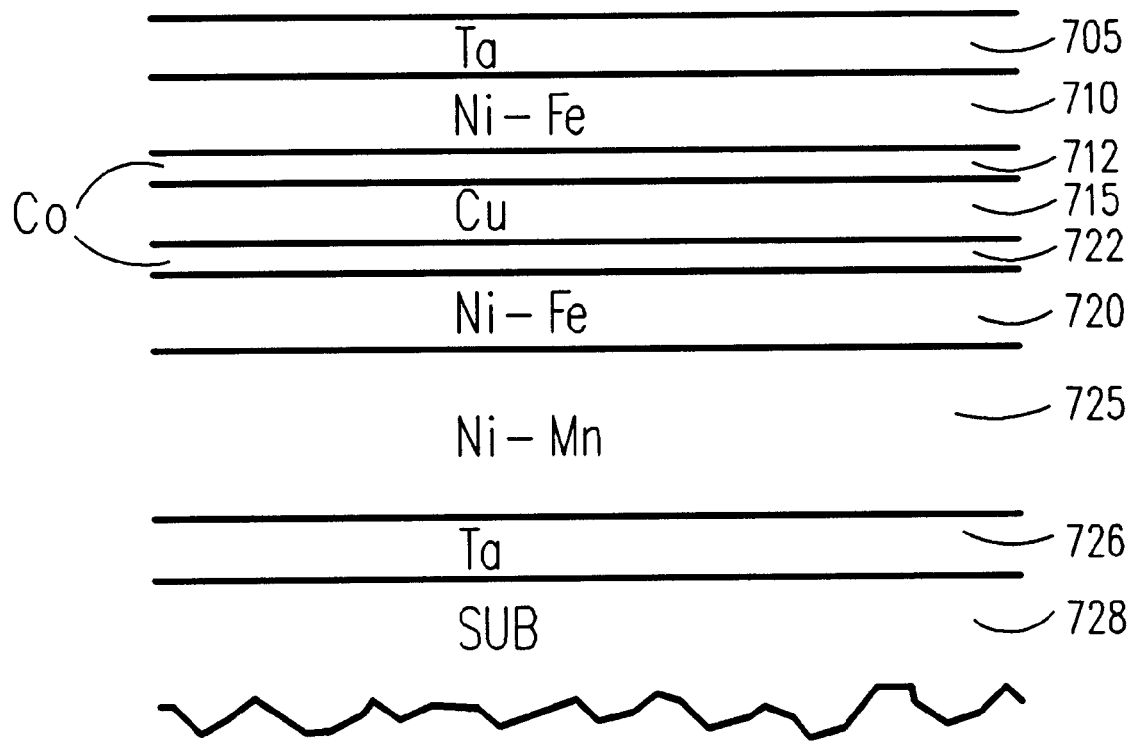

Referring now to FIGS. 7a and 7b, in this alternative embodiment the Ta/Ni—Mn/Ni—Fe/Co/Cu/Co/Ni—Fe/Ta SV sensor structure is fabricated by first depositing the Ta 726, Ni—Mn 725 and Ni—Fe 720 layers on the substrate 728. The structure is then annealed in-situ at a temperature in the range of 240 C. to 320 C. in the presence of a transverse magnetic field. At a temperature of 320 C., an in-situ anneal time of 20 minutes is sufficient to achieve the desired exchange coupling between the Ni—Mn and Ni—Fe layers. Longer annealing times ranging from 20 minutes up 100 hours can also be used to obtain large exchange coupling without degradation of the SV effect due to interdiffusion at the layer interfaces. At the temperature of about 240 C., an in situ time of about 10 hours is sufficient to achieve the desired exchange coupling between the AFM and pinned layers. After the deposited layers 730 are annealed, a longitudinal magnetic field is applied and the Co layer 722, the Cu spacer layer 715, the second Co layer 712, the Ni—Fe free layer 710 and the Ta cap layer 705 are sequentially deposited to complete the structure of the center region of the SV sensor.

This process of in-situ annealing simplifies the processing by eliminating the intermediate Ta capping process and the subsequent ion-milling to remove the intermediate Ta cap layer and a portion of the pinned layer required in the preferred embodiment described above.

As will be apparent to one skilled in the art, the fabrication methods of the preferred embodiment and the alternative embodiment described herein may be used to fabricate SV sensors having the layered structure Ta/Ni—Mn/Ni—Fe/Cu/Ni—Fe/Ta or SV sensors having the layered structure Ta/Ni—Mn/Ni—Fe/Co/Cu/Ni—Fe/Ta or SV sensors having the layered structure Ni—Mn/pinned layer/spacer/free layer.

It will also be apparent to one skilled in the art that alternative AFM materials such as Pd—Mn and Pt—Mn with Mn composition in the 46–60% range may also be used to fabricate SV sensors according to the present invention.

It will be further apparent to one skilled in the art that alternative spacer layer materials such as gold and silver may also be used to fabricate SV sensors according to the present invention.

It will be still further apparent to one skilled in the art that, while all the structures described herein have used a Ta film as the underlayer material, alternative materials such as Hf, Zr or Y may also be used in place of the Ta underlayer for any or all of the structures of the present invention. Further, it will be apparent that the underlayer may alternatively be part of the substrate material so that no distinct underlayer deposition is needed.

While the present invention has been particularly shown and described with reference to the preferred embodiment thereof, nevertheless, it will be understood by those skilled in the art that various modifications may be made therein without departing from the spirit, scope, and teaching of the present invention.

Accordingly, it is to be understood that the invention disclosed herein is not to be limited by the illustrated embodiment, but only by the scope of the appended claims.

I claim:

1. A method of manufacturing a spin valve (SV) sensor having an air bearing surface, comprising:
   depositing antiferromagnetic (AFM) material on a suitable substrate to form an AFM layer;
   depositing a first ferromagnetic material on said AFM layer to form a pinned layer;
   annealing said AFM and pinned layers while applying a transverse magnetic field, said transverse magnetic field being perpendicular to the air bearing surface;
   depositing a non-magnetic electrically conducting material on said pinned layer to form a spacer layer; and
   depositing a second ferromagnetic material on said spacer layer to form a free layer, said spacer and free layers being deposited while applying a longitudinal magnetic field, said longitudinal magnetic field being parallel with the air bearing surface.

2. A method of manufacturing an SV sensor according to claim 1, wherein said annealing is carried out at the temperature of about 320 C. for a period of time in the range of about 20 minutes to 2 hours.

3. A method of manufacturing an SV sensor according to claim 1, wherein said annealing is carried out at the temperature of about 240 C. for a period of time in the range of about 2 to 100 hours.

4. A method of manufacturing an SV sensor according to claim 1, wherein said AFM material is a Mn alloy selected from the group consisting of Ni—Mn, Pd—Mn and Pt—Mn having a composition within the range of 46 to 60 atomic percent Mn.

5. A method of manufacturing an SV sensor according to claim 1, wherein said spacer layer is made of copper.

6. A method of manufacturing an SV sensor according to claim 1, wherein said spacer layer is made of gold.

7. A method of manufacturing an SV sensor according to claim 1, wherein said spacer layer is made of silver.

8. A method of manufacturing an SV sensor according to claim 1, wherein said free and pinned layers are made of Ni—Fe.

9. A method of manufacturing a spin valve (SV) sensor having an air bearing surface, comprising:
   depositing antiferromagnetic (AFM) material on a suitable substrate to form an AFM layer;
   depositing a first ferromagnetic material on said AFM layer to form a pinned layer;
   forming a capping layer on said pinned layer;
   annealing said AFM, pinned and cap layers while applying a transverse magnetic field, said transverse magnetic field being perpendicular to the air bearing surface;
   removing said cap layer and a predetermined portion of said pinned layer;
   depositing a non-magnetic electrically conducting material on said pinned layer to form a spacer layer; and
   depositing a second ferromagnetic material on said spacer layer to form a free layer, said spacer and free layers being deposited while applying a longitudinal magnetic field, said longitudinal magnetic field being parallel with the air bearing surface.

10. A method of manufacturing an SV sensor according to claim 9, wherein said annealing is carried out at the temperature of about 320 C. for a period of time in the range of about 20 minutes to 2 hours.

11. A method of manufacturing an SV sensor according to claim 9, wherein said annealing is carried out at the temperature of about 240 C. for a period of time in the range of about 2 to 100 hours.

12. A method of manufacturing an SV sensor according to claim 9, wherein said AFM material is a Mn alloy selected from the group consisting of Ni—Mn, Pd—Mn and Pt—Mn having a composition within the range of 46 to 60 atomic percent Mn.

13. A method of manufacturing an SV sensor according to claim 9, wherein said spacer layer is made of copper.

14. A method of manufacturing an SV sensor according to claim 9, wherein said spacer layer is made of gold.

15. A method of manufacturing an SV sensor according to claim 9, wherein said spacer layer is made of silver.

16. A method of manufacturing an SV sensor according to claim 9, wherein said free and pinned layers are made of Ni—Fe.

\* \* \* \* \*